United States Patent [19]

Nishibe

[11] Patent Number: 5,467,248
[45] Date of Patent: Nov. 14, 1995

[54] RELAY CONTROL CIRCUIT

[75] Inventor: Yasushi Nishibe, Niwa, Japan

[73] Assignee: Kabushiki Kaisha Tokai-Rika-Denki-Seisakusho, Aichi, Japan

[21] Appl. No.: 175,223

[22] Filed: Dec. 29, 1993

[30] Foreign Application Priority Data

Jan. 19, 1993 [JP] Japan .................................. 5-006615

[51] Int. Cl.[6] ................................................. H01H 47/22
[52] U.S. Cl. ............................ 361/170; 361/194; 361/95; 361/196
[58] Field of Search ...................... 361/195, 202, 361/189, 190, 170, 194, 94, 95, 75, 73; 307/141.4, 141

[56] References Cited

U.S. PATENT DOCUMENTS

| | | | |
|---|---|---|---|
| 3,153,747 | 10/1964 | Sofianek et al. | 361/98 |
| 3,774,082 | 11/1973 | Chang | 361/196 |
| 3,794,858 | 2/1974 | Squires | 361/196 X |
| 3,950,675 | 4/1976 | Weber et al. | 361/196 X |
| 4,035,669 | 7/1977 | Yokoyama | 361/196 X |
| 4,991,049 | 2/1991 | Kadah | 361/28 |

Primary Examiner—A. D. Pellinen
Assistant Examiner—Fritz M. Fleming
Attorney, Agent, or Firm—Oliff & Berridge

[57] ABSTRACT

A relay control circuit in which a capacitor is used as a power source of a transistor which prohibits operation of the transistor which is operated by input by switch operation. If power is no longer supplied to the entire relay control circuit while the capacitor is discharging, switch input is prohibited.

8 Claims, 2 Drawing Sheets

RELAY CONTROL CIRCUIT

BACKGROUND OF THE INVENTION

1. Field of the Invention

The present invention relates to a relay control circuit, and in particular, to a relay control circuit which can prohibit the input of an operation signal of a relay, which supplies power to a load such as a motor, for a certain period of time while the load is not driven (standby state).

2. Related Art

In a relay control circuit which controls the driven state and the non-driven state of a load such as a motor by turning a relay on and off (e.g., a circuit which can control the driven state and the non-driven state of a motor for driving a window glass in a power window apparatus by turning a relay on and off), if a foreign object becomes caught by the window glass while the motor is being driven, the movement of the window glass is obstructed by the foreign object. In order to prevent damage to the foreign object and the drive system which may be caused in such a case, a function may be added which detects an overloaded state of the motor by use of motor current or the like, and when an overloaded state is detected, the catching of the foreign object which stops the driving of the motor is detected and prevented. Window glasses at the front passenger's seat and the rear passengers' seats can be operated not only by respective operating switches for the seats, but also by a operating switch (master switch) provided at the driver's seat. Therefore, even if a power window controller detects the catching of a foreign object by the window glass, there is the concern that an operation switch may be operated again. Here, it may be desirable to prohibit the input of the relay signal for a certain period of time in order to maintain the non-driven state of the load. Further, in power antenna devices, power pole devices and the like, because a moving portion is provided in a place which is difficult for the operator to monitor, it may be desirable in these cases as well to prohibit the input of a relay operation signal for a certain period of time.

When it is desired to prohibit, for a certain time, the input of the operation signal of the relay which drives the load (for example, in a circuit using two relays to control the forward rotation/reverse rotation of a motor which is a load), an input prohibiting function of the relay control circuit is operated, i.e., a function which simultaneously switches the two relay contacts to the power source side so that voltage is applied in the directions of forward rotation/reverse rotation. In this way, the load is not driven, and the input of the relay operation signal, such as a switch input or the like, can be prohibited for a certain period of time. However, in order to operate this input prohibiting function, it is necessary to supply power to the relay control circuit, which limits the reduction of the amount of power consumed.

In a circuit which applies voltage in one direction to a motor, which is a load, by using one relay, if the circuit is structured such that power is supplied to a relay control circuit via the relay, a circuit structure in which almost no power is consumed while the load is not driven can be realized. However, in such a case, because power is not being supplied to the relay control circuit as well while the load is not being driven, it is difficult to maintain the input prohibiting function which prohibits input of the relay operation signal to the relay control circuit for a certain time. Accordingly, in this case, in order to operate the input prohibiting function of the relay control circuit, it is necessary to supply power to a portion or to all of the relay control circuit even when the load is not driven.

SUMMARY OF THE INVENTION

The present invention was developed in light of the above circumstances, and an object thereof is to provide a relay control circuit in which input of a relay operation signal can be prohibited for a certain period of time in a state in which power is not supplied when a load such as a motor or the like is not being driven.

The present invention is a relay control circuit including switching means for operating a relay so that power is supplied to a load when an operation signal is being input; a first circuit which supplies power via the relay and which outputs an input prohibiting signal which prohibits input of the operation signal to the switching means; and a second circuit which prohibits input of the operation signal to the switching means and is charged when the input prohibiting signal is being input, and which discharges and prohibits input of the operation signal to the switching means when the input prohibiting signal is no longer input.

In accordance with the above structure, when the operation signal is input to the switching means, the relay operates so that power is supplied to the load and the first circuit. While power is being supplied, if the input prohibiting signal is outputted from the first circuit, the second circuit prevents input of the operation signal to the switching means and is charged during the time that the input prohibiting signal is input. Due to the prohibition of the input of the operation signal to the switching means, the supply of power to the load and the first circuit via the relay is stopped. Accordingly, the first circuit stops outputting the input prohibiting signal. As a result, the input prohibiting signal is no longer input to the second circuit, and the second circuit discharges, and the input of the operation signal to the switching means is prohibited. In this way, the input of the operation signal to the switching means, i.e., the input of the relay operation signal, is prohibited for a certain period of time in a state in which power is not being supplied when the load is not being driven.

As described above, in accordance with the present invention, because the second circuit discharges so that input of the operation signal to the switching means is prohibited for a certain time from the stopping of the supply of power to the first circuit, input of the relay operation signal can be prohibited effectively. Accordingly, input of the relay operation signal can be prohibited for a certain time in a state in which power is not being supplied when the load is not being driven (and accordingly, current is not consumed). The present invention provides a superior effect in that, for example, when a power window controller detects the catching of a foreign object and stops a motor, even if a passenger is unaware of this and operates an operation switch, the motor can be reliably maintained in a stopped state for a certain time.

DESCRIPTION OF THE PREFERRED EMBODIMENTS

The first embodiment of the present invention will be described hereinafter with reference to FIG. 1.

Figure 1:
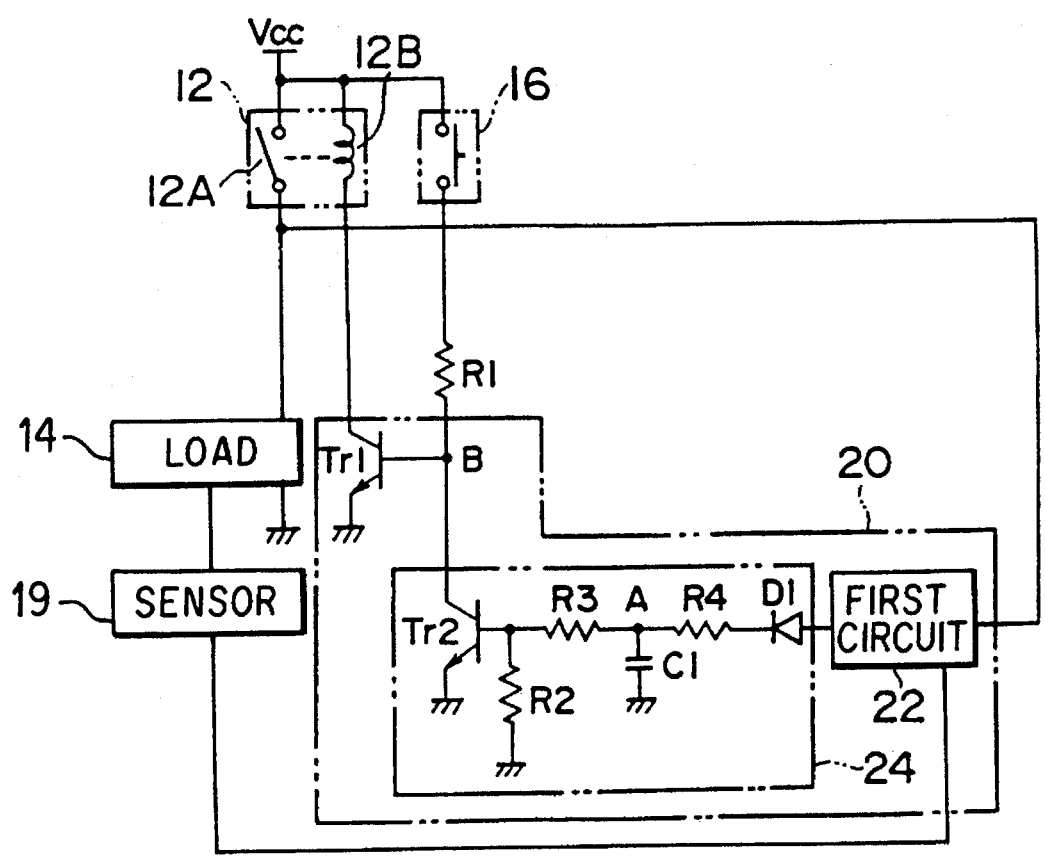
FIG. 1 is a circuit view illustrating the structure of a first embodiment of the present invention.

In FIG. 1, a load 14 (e.g., a motor) is connected between a power source and the ground via a relay contact 12A. An end of a relay coil 12B, which together with the relay contact 12A forms a relay 12, is connected to the power source. The other end of the relay coil 12B is connected to the collector of an emitter-ground NPN transistor Tr1 which serves as a switching means.

One end of a switch 16 is connected to the power source. The other end of the switch 16 is connected to both the collector of an emitter-ground NPN transistor Tr2 and the base of the transistor TR1 via a resistor R1.

A relay control circuit 20 is formed by the transistor Tr1, a first circuit 22 and a second circuit 24. Power is supplied to the first circuit 22 via the relay contact 12A, and in accordance with the output of a sensor 19, the first circuit 22 outputs a high level signal as an input prohibiting signal. While the input prohibiting signal is being input, the second circuit 24 is charged and prohibits input of the signal to the transistor Tr1. When the input prohibiting signal is no longer input, the second circuit 24 discharges and prohibits input of the signal to the transistor Tr1.

The second circuit 24 includes a diode D1, resistors R4, R3, a resistor R2, and a capacitor C1. The diode D1 prevents reverse current, and the anode thereof is connected to the output end of the first circuit 22. The resistors R4, R3 are connected in series between the cathode of the diode D1 and the base of a transistor Tr2. The resistor R2 is interposed between the base of the transistor Tr2 and the ground. The capacitor C1 is interposed between the ground and a connecting point A of the resistors R4, R3.

Next, operation of the present embodiment will be described with reference to FIG. 1.

When the switch 16 is turned on, base current flows through the resistor R1 to the transistor Tr1 so that the transistor Tr1 is turned on. The relay coil 12B is energized, and the relay 12 is turned on. Accordingly, power is supplied to the load 14 and the first circuit 22 via the relay contact 12A.

In this state, when it becomes necessary to stop the supply of power to the load 14 for a certain time due to the input from a sensor 19 or the like (e.g., the load 14 is a motor and a signal is input from a sensor 19 which detects that the motor is overloaded), an input prohibiting signal (a high level signal) is inputted from the first circuit 22 via the diode D1. Due to the input of the input prohibiting signal, current flows to the diode D1 and the resistor R4, and the capacitor C1 is charged by the current. Due to the charging of the capacitor C1, the electric potential at a point A at the high electric potential side of the capacitor C1 rises. Base current flows through the resistor R3 to the transistor Tr2 so that the transistor Tr2 is turned on. Accordingly, because current flows between the collector and the emitter of the transistor Tr2, the base current of the transistor Tr1 is cut, and the transistor Tr1 is turned off. As a result, the energization of the relay coil 12B is stopped, and the relay contact 12A is turned off. The supply of power to the load 14 and the first circuit 22 is thereby stopped. Due to the stopping of the supply of power to the first circuit 22, the output of the input prohibiting signal is stopped.

Although the input prohibiting signal is no longer input to the second circuit 24, for a certain time until the on state of the transistor Tr2 can no longer be maintained due to the discharge of the capacitor C1, base current flows from the capacitor C1 through the resistor R3 to the transistor Tr2 (current is prevented from flowing to the resistor R4 side by the diode D1). Therefore, the transistor Tr2 remains on.

During the certain period of time until the on state of the transistor Tr2 can no longer be maintained due to the discharge of the capacitor C1, even if the switch 16 is turned on, the base current of the transistor Tr1 continues to be cut by the transistor Tr2 so that the base current does not flow to the transistor Tr1 and the relay 12 is prevented from being turned on.

Thereafter, due to the discharge of the capacitor C1, the electric potential at point A drops, and the transistor Tr2 can no longer make the current from the resistor R1 flow to the ground. Namely, when the transistor Tr2 is equivalently turned off, base current is supplied through the resistor R1 to the transistor Tr1, and the transistor Tr1 is turned on so that the relay 12 can be turned on again.

As described above, in accordance with the present embodiment, even if the supply of power to the first circuit 22 is stopped, the input of the relay 12 operation signal from the switch 16 can be prevented for a certain time until the on state of the transistor Tr2 can no longer be maintained due to the discharge of the capacitor C1. Accordingly, a non-driven state of the load 14 can be reliably prevented, and the amount of power consumed can be markedly reduced.

Even if the output of another relay control circuit is connected at point B in FIG. 1, input of the relay 12 operation signal from this other relay control circuit can be prohibited for a certain period of time.

Figure 2:
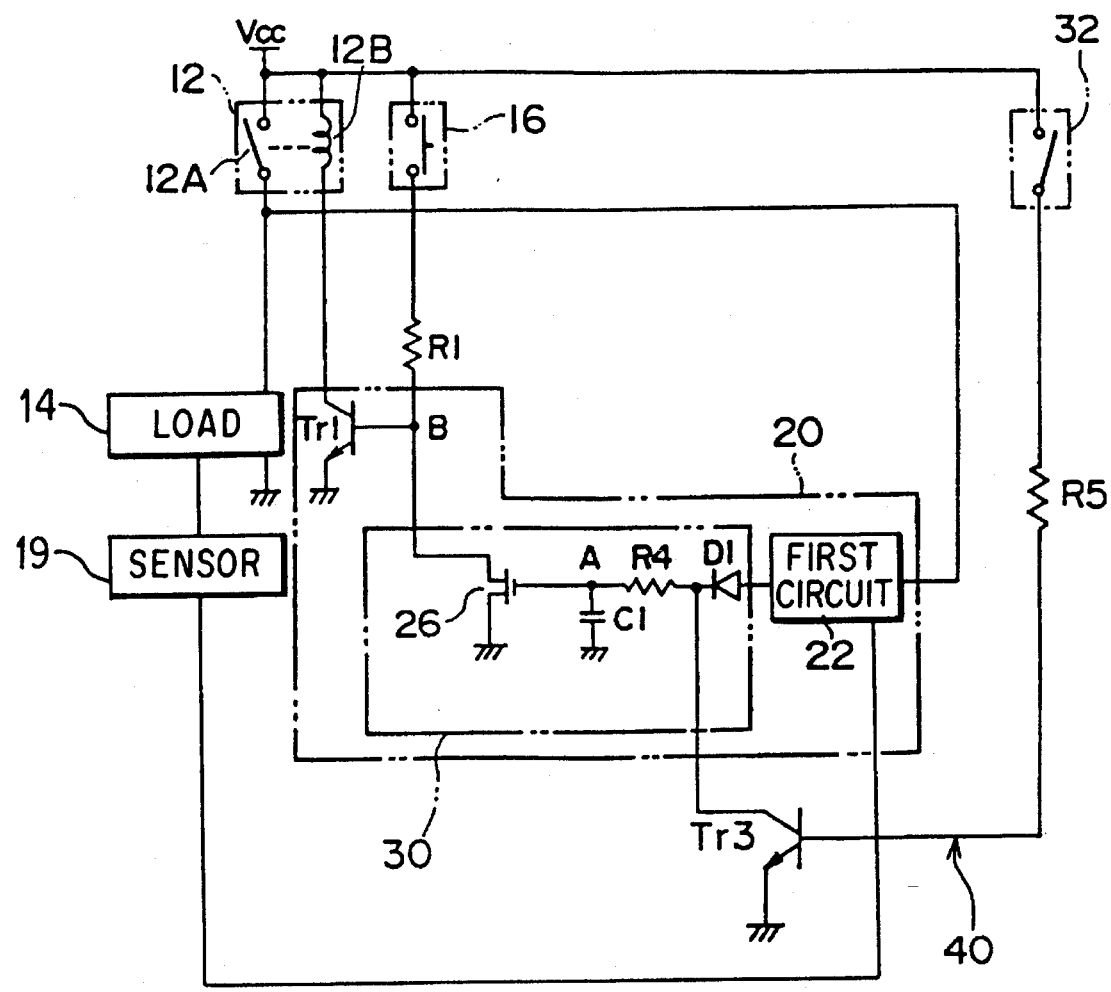
FIG. 2 is a circuit view illustrating the structure of a second embodiment of the present invention.

A second embodiment of the present invention will be described hereinafter with reference to FIG. 2. In the second embodiment, structural portions which are the same or similar to those of the above-described first embodiment are denoted by the same reference numerals, and description thereof is omitted.

The distinctive feature of the second embodiment is that, in the second embodiment, a second circuit 30 is provided instead of the second circuit 24 in the above-described first embodiment. In the second circuit 30, a MOS-FET 26 which is a voltage control element is provided in place of the bipolar transistor Tr2 in the first embodiment. Further, in the second embodiment, the resistors R2, R3 have been eliminated. Other than these differences, the second circuit 30 is structured similarly to the second circuit 24 of the first embodiment. In accordance with the second circuit 50, when the capacitor C1 is charged once, the on state of a MOS-FET 26 is maintained for a long period of time (i.e., semipermanently as determined by properties of the MOS-FET 26), and the input of the relay 12 operation signal from the switch 16 can be prohibited over a long period of time.

In the second embodiment, a cancellation circuit 40, which cancels the on state of the MOS-FET 26 from the exterior of the relay control circuit 20, is added to the second circuit 30. The cancellation circuit 40 includes an emitter-ground NPN transistor Tr3, whose collector is connected to the connecting point between the resistor R4 and the diode D1, and a cancellation switch 32, one end of which is connected to the base of the transistor Tr3 via a resistor R5. The other end of the cancellation switch 32 is connected to the power source. When the capacitor C1 is charged and the MOS-FET 26 is turned on, if the cancellation switch 32 is turned on, current is conducted between the collector and the emitter of the transistor Tr3 and current flows from the capacitor C1 via the resistor R4 to the ground so that the capacitor C1 discharges. As a result, the MOS-FET 26 is turned off, and the prevention of the input of the relay 12 operation signal is canceled.

The structures of other portions are the same as those of the first embodiment.

As described above, in the second embodiment, the same operational effects as those of the first embodiment are obtained. Further, in accordance with the second circuit 30, the input of the relay 12 operation signal can be prevented over a long period of time, and this prevention can be canceled by the cancellation switch 32.

What is claimed is:

1. A relay control circuit comprising:

switching means for operating a relay that supplies power to a load when an operating signal is supplied to said switching means;

a first circuit that receives power from said relay and outputs an input prohibiting signal in response to a condition of the load; and a second circuit that receives the input prohibiting signal, said second circuit charging and prohibiting input of said operation signal to said switching means when said input prohibiting signal is input from said first circuit, said second circuit discharging when said input prohibiting signal is removed to further prohibit input of said operation signal to said switching means while said second circuit discharges.

2. A relay control circuit according to claim 1, wherein said switching means comprises a transistor having a base connected to said second circuit, said transistor outputting a signal for operating said relay from a collector of said transistor when said operation signal is not prohibited from being input from said second circuit to the base of said transistor.

3. A relay control circuit according to claim 1, wherein said condition is an overloaded condition of the load.

4. A relay control circuit according to claim 1, wherein said second circuit discharges for a predetermined time.

5. A relay control circuit according to claim 1, wherein said second circuit comprises a capacitor and a transistor having a base connected to the capacitor, said capacitor charging when said input prohibiting signal is output from said first circuit, said charged capacitor supplying current to the base of said transistor and further prohibiting input of the operation signal to said switching means.

6. A relay control circuit according to claim 1, wherein when said second circuit is charged, input of said operation signal to said switching means is prohibited for a duration of time determined by properties of said second circuit.

7. A relay control circuit according to claim 1, wherein said second circuit comprises a capacitor and a field effect transistor having a gate, said capacitor charging when said input prohibiting signal is output from said first circuit, said charged capacitor supplying current to the gate of said field effect transistor and further prohibiting input of said operation signal to said switching means.

8. A relay control circuit according to claim 6, further comprising:

canceling means for canceling prohibition of said operation signal to said switching means.

* * * * *